United States Patent
Shibata et al.

(10) Patent No.: US 7,202,007 B2
(45) Date of Patent: Apr. 10, 2007

(54) METHOD OF FORMING PATTERNED FILMS

(75) Inventors: Norio Shibata, Kanagawa (JP); Junji Nakada, Kanagawa (JP); Jun Fujinawa, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/456,472

(22) Filed: Jun. 9, 2003

(65) Prior Publication Data
US 2004/0241570 A1 Dec. 2, 2004

(30) Foreign Application Priority Data
Jun. 7, 2002 (JP) .............................. 2002-166533

(51) Int. Cl.
- G03C 5/58 (2006.01)
- G03C 11/12 (2006.01)
- B41M 3/12 (2006.01)
- C23C 16/00 (2006.01)
- B05D 3/00 (2006.01)

(52) U.S. Cl. ............... 430/199; 430/258; 156/232; 156/234; 427/146; 427/248.1; 427/255.6; 427/294; 427/250

(58) Field of Classification Search ........ 430/199, 430/258; 156/232, 234; 427/146, 248.1, 427/250, 255.6, 294
See application file for complete search history.

(56) References Cited

U.S. PATENT DOCUMENTS

| | | | |
|---|---|---|---|
| 5,328,534 A * | 7/1994 | Calhoun et al. | 156/150 |
| 5,399,372 A * | 3/1995 | Grimes et al. | 427/131 |
| 6,792,679 B1 * | 9/2004 | Tai et al. | 29/877 |
| 2002/0148113 A1 * | 10/2002 | Forrest et al. | 29/847 |
| 2003/0175427 A1 | 9/2003 | Loo et al. | |

FOREIGN PATENT DOCUMENTS

| | | |
|---|---|---|
| JP | 08-171008 A | 7/1996 |
| JP | 2918037 B | 4/1999 |
| JP | 2000-012216 A | 1/2000 |

OTHER PUBLICATIONS

Changsoon Kim, et al.; "Nanolithography based on patterned metal transfer and its application to organic electronic devices"; Applied Physics Letters, vol. 80, No. 21, May 27, 2002, pp. 4051-4053.

Changsoon Kim, et al.; "Micropatterning of Organic Electronic Devices by Cold-Welding"; Science, vol. 288, May 5, 2000; pp. 831-833.

Thomas Granlund, et al.; "Patterning of Polymer Light-Emitting Diodes with Soft Lithography"; Advanced Materials; vol. 12, No. 4, Feb. 17, 2000; pp. 269-273.

Thomas Granlund et al.: "Patterning of Polymer Light-Emitting Diodes with soft Lithography"; Advanced Materials; vol. 12, No. 4, Feb. 17, 2000; pp. 269-273.

* cited by examiner

*Primary Examiner*—Richard L. Schilling
(74) *Attorney, Agent, or Firm*—Sughrue Mion, PLLC (57) ABSTRACT

This method forms a patterned film. The method prepares a transfer member having a transfer surface on which asperities are formed in accordance with a film pattern to be formed, performs stripping treatment on surfaces of at least ridges formed on the transfer surface of the transfer member, thereafter forms a thin film formed by a technology of vacuum film formation on the surfaces of the at least ridges formed on the transfer surface of the transfer member and transfers the thin film formed on the surfaces of at least ridges of the transfer member onto a substrate, thereby forming the patterned film on the substrate.

20 Claims, 1 Drawing Sheet

METHOD OF FORMING PATTERNED FILMS

BACKGROUND OF THE INVENTION

This invention relates to the art of forming patterned films by the technology of vacuum film formation. More particularly, the invention relates to a method of forming patterned films by the technology of vacuum film formation at low cost and with high productivity.

Thin patterned films are formed on substrates by the technology of vacuum film formation (which are hereunder referred to as "vacuum thin films") for use in a variety of applications including transparent and opaque electrodes for use in electronic displays such as liquid-crystal displays, light emitters (pixels) for use in electronic displays such as EL (electroluminescence), TFT (thin-film transistor) devices for use as switching devices in liquid-crystal displays, etc. and patterned magnetic media having a recording layer divided into 1-bit segments.

An exemplary method of forming patterned vacuum thin films on substrates comprises the steps of forming a continuous vacuum thin film on a surface of a substrate, then forming by photolithography a resist layer exposed in accordance with the pattern to be formed, and removing the unwanted thin film by dry or wet etching to pattern the vacuum thin film.

In another applicable method, a mask having openings that comply with the pattern to be formed is used and vacuum film formation is performed such that only the film forming material that passes through the mask is deposited on a substrate to form a patterned vacuum thin film.

In yet another applicable method, a continuous vacuum thin film is formed on a surface of a substrate and energy beams (e.g. laser beams) modulated in accordance with the pattern to be formed are applied either alone or in combination with the etching technology to form a patterned vacuum thin film.

A method for manufacturing a color Organic EL display disclosed in JP 2918087 B comprises the steps of subjecting a luminescent organic material to the evaporation onto a transfer substrate having highly thermal-conductive protrusions, which are patterned after the representing pixels, to thereby form a film, pressing the transfer substrate having the luminescent organic material formed thereon into the film against a transparent conductive film substrate (or a hole moving layer formed on a transparent conductive film), and sublimating the luminescent organic material by heating the protrusions of said transfer substrate so as to transfer the material to the surface of the transparent conductive film substrate.

However, these methods have their own problems with productivity, manufacturing cost, material options, etc.

The first-mentioned approach which utilizes photolithography provides high precision and definition in patterning; however, on account of the need for a large number of steps including the cleaning of the substrate, application of a resist, pre-bake, exposure and post-bake of the applied resist, development and etching, this approach requires massive initial investment and yet the yield of production is low. Because of the great number of steps involved and the low production yield, the first approach is costly and yet low in productivity.

In the second method which uses a mask to form a patterned vacuum thin film, the film forming material builds up on the mask as the film formation progresses. In the case of forming a precise and high-definition pattern, the mask having this buildup of the film forming material soon becomes unsuitable for use and must be changed or regenerated within a short time. This extra work lowers productivity and increases the manufacturing cost.

In order to form a precise pattern, vacuum film formation is preferably performed on the substrate as it is in contact with the mask. However, this increases the chance of damaging the substrate and the two members must be spaced apart. But then, the vapor of the film forming material and the like do not flow through the mask but get around it to blur the boundaries between individual elements of the pattern being formed.

In the method which uses energy beams modulated in accordance with the pattern to be formed, the need to scan the energy beams introduces difficulty in achieving high productivity. In order to improve productivity, a light source of high power is necessary but then the equipment cost increases and so does the complexity of the equipment mechanism. In addition, depending on the power of the energy to be applied, there is a limit on the film thickness that can be processed.

If energy beams are combined with the etching technology, an increased number of steps are involved and other disadvantages occur as are experienced in the first-mentioned photolithographic approach.

The problems existing in the above methods of forming patterned films can be solved by applying the method disclosed in JP 2918037 B to the formation of patterned films.

In the method of the Japanese patent, however, the transfer substrate is heated to a high temperature of near 500° C. so as to transfer the film forming material to a substrate (on which a film is to be formed) by the sublimation of the material, which makes it impossible to form a patterned film of a material with a lower heat resistance and confines the material for patterned film formation to those having a good sublimability or evaporability in view of the productivity. In addition, the transfer substrate having protrusions is required to be resistant to such temperatures as above. Accordingly, the patterned film forming material and the transfer substrate have only very narrow options so that the method of the Japanese patent is disadvantageous in terms of the choice or universality.

SUMMARY OF THE INVENTION

An object of the present invention is to solve the aforementioned problems of the prior art by providing a patterned film forming method according to which thin films based on the technology of vacuum film formation and having precise and high-definition patterns can be formed with high productivity and at low cost and in which patterned film forming materials, substrate materials, and so forth can be selected from a wide choice of options.

In order to attain the object described above, the present invention provides a patterned film forming method, comprising steps of: preparing a transfer member having a transfer surface on which asperities are formed in accordance with a film pattern to be formed; performing stripping treatment on surfaces of at least ridges formed on the transfer surface of the transfer member; thereafter forming a thin film formed by a technology of vacuum film formation on the surfaces of the at least ridges formed on the transfer surface of the transfer member; and transferring the thin film formed on the surfaces of the at least ridges of the transfer member onto a substrate, thereby forming a patterned film on the substrate.

Preferably, the vacuum film formation is performed on the transfer surface of the transfer member on which the asperities are formed, thereby forming the thin film formed by the technology of the vacuum film formation on the surfaces of the at least ridges formed on the transfer surface of the transfer member.

Preferably, the vacuum film formation is performed on a surface of a suitable member by the technology of the vacuum film formation and subsequently transferred to the surfaces of the at least ridges of the transfer surface of the transfer member, thereby forming the thin film formed by the technology of the vacuum film formation on the surfaces of the at least ridges formed on the transfer surface of the transfer member.

DETAILED DESCRIPTION OF THE INVENTION

On the following pages, the patterned film forming method of the invention is described in detail.

In the invention, a master, or a transfer member having a surface (transfer surface) with asperities formed in accordance with the film pattern to be formed is employed such that a thin film formed by the technology of vacuum film formation is transferred to a substrate to form a patterned thin film. Briefly, a thin film is formed on surfaces of at least the ridges on a master (the film is hereunder referred to as a vacuum thin film) and the vacuum thin film on the ridges is transferred to a substrate. As a result, a patterned film is formed by the technology of vacuum film formation at low cost with high productivity.

As mentioned above, the master to be used in the present invention has a transfer surface with asperities formed in accordance with the film pattern to be formed. The master may be formed of any material in any shape as long as it has sufficient strength against external forces as are applied during transfer under pressure of the vacuum thin film to the substrate.

Hence, the master may be discrete (discontinuous) as exemplified by a plate, a cylinder, a prism and a sphere that have planes with transfer surfaces formed thereon. It may also be a drum having a transfer surface formed on the side or an endless belt having a transfer surface formed on a side. Alternatively, the master may be continuous as exemplified by a web such as a metal strip having a transfer surface formed on a side. The transfer surface may be planar or curved.

The master may be formed of a variety of materials as long as they secure adequate strength. Examples that may be employed are a variety of metallic materials, ceramic materials, resin materials, glass, films, etc. Glass is in particular suitable because a master formed of glass is excellent in its patterned state such as the edge entirety and the pattern shape and has a surface of high evenness.

The method of forming asperities on the transfer surface of the master is not limited in any particular way and a variety of plotting-like processing methods can be employed as appropriate for various factors including the material of which the master is formed and the patterned film to be formed.

Examples include machining, processing by the combination of photolithographic and etching techniques as are employed in semiconductor device fabrication, and processing by electroforming.

According to these processing methods, fine patterns comparable to those obtained by photolithography can be formed on the master with high dimensional precision and, hence, one can form patterned films having patterns of as high precision and definition as those obtained by photolithography.

The level difference in the asperities (the height of the ridges) on the transfer surface of the master is not limited to any particular value and depending on such factors as the thickness of the patterned film to be formed, the asperities may have a sufficient level difference to ensure that only the vacuum thin film on the ridges can be transferred to the substrate. Greater level differences are preferred from the viewpoint of productivity and the like since they reduce the frequency of cleaning (regenerating) the master.

Considering these points and other factors such as processing precision and definition and the formation of patterned vacuum thin films in the present invention which suffice to be thinner than resin coats, the level difference in asperities is preferably adjusted to lie between 10 nm and 500 μm, more preferably between 100 nm and 100 μm, if a vacuum thin film is to be formed directly on the master's transfer surface in a case to be described later. For the same reason, the level difference in asperities is preferably adjusted to lie between 10 nm and 500 μm, more preferably between 100 nm and 100 μm, if a vacuum thin film formed on any suitable members is to be transferred to the master's transfer surface (surfaces of the ridges) in another case which is also described later.

According to the patterned film forming method of the invention, a vacuum thin film is formed on surfaces of at least the ridges on the master's transfer surface and the vacuum thin film on the ridges is transferred to the substrate, thereby forming a patterned vacuum thin film.

Two approaches may be employed to form a vacuum thin film on the transfer surface of the master. In one approach, a vacuum thin film is directly formed on the transfer surface by the vacuum film forming technology; in the other approach, a vacuum thin film is first formed on a surface of any suitable member and then transferred to the master's transfer surface (the surfaces of the ridges).

The vacuum film forming technology that can be employed in the present invention to form thin films (dry films) on the transfer surface of the master or a sur face of any suitable member just mentioned above is not limited in any particular way and all types of vacuum film forming techniques can be adopted, as exemplified by sputtering, vacuum vapor deposition (evaporation), ion plating, and CVD (chemical vapor deposition). The film forming conditions may also be determined as appropriate for the vacuum film forming technique adopted, the composition of the vacuum thin film to be formed and its thickness.

The film to be formed is not limited in any particular way and all types that can be formed as film by the vacuum film forming technology may be adopted, as exemplified by transparent conductive films of indium-tin oxide, zinc oxide, titanium nitride, etc.; magnetic films of cobalt alloy, chromium alloy, etc.; oxide films of silicon oxide, titanium oxide, aluminum oxide, etc.; nitride films of silicon nitride, boron nitride, etc.; metallic films, carbide films and metallic compound films of aluminum, zinc, nickel, chromium, titanium and other metals; as well as organic material films of organic compounds, organic metal materials, etc. The thickness of the vacuum thin film may be adjusted to any value that is appropriate for a particular use of the patterned film (or the substrate having the patterned film formed thereon).

JP 8-171008 A discloses a process for producing color filters which comprises the steps of forming a colored pattern on a plate having a predetermined pattern and transferring the colored pattern to a transparent substrate, as well as a process for producing color filters which comprises the steps of preparing a dry sheet having a colored solidified film in which a colorant is dispersed, transferring the colored solidified film from the dry sheet to a plate having a predetermined pattern and further transferring the colored solidified film to a transparent substrate.

However, each of the methods disclosed in JP 8-171008 A is a so-called wet-based film forming approach which employs a resin paint having a colorant dispersed therein and it relates to a technology fundamentally different from the present invention which employs the vacuum film forming technology.

According to the present invention which employs the vacuum film forming technology, patterned films of high definition and precision can be formed with high productivity and at low cost. This is not possible if the wet-based film forming methods such as disclosed in JP 8-171008 A are employed and patterned films of high definition and precision cannot be formed with high productivity and at low cost.

In the wet-based film forming methods, a film of resin paint (hereunder referred to as a resin coat) is directly formed on the transfer surface of a plate (which is hereunder referred to as a master in accordance with the present invention) by first applying (which may be dip coating) the paint to the transfer surface and then drying the applied paint.

However, when a resin coat is formed on the transfer surface by application, it is very difficult to control the film thickness with high precision and no patterned films of appropriate thickness can be formed. If the resin paint is applied to the transfer surface, it will also adhere to the side walls of ridges on account of sagging and other problems. As a result, when the resin coat is transferred to the substrate, the film on those side walls is also transferred, making it impossible to form a patterned film of high definition in high precision.

Thus, except by preparing a dry film having a resin coat, transferring the resin coat from the dry film onto the ridges of a master and then transferring it to the substrate, there is substantially no method of forming patterned films using the resin paint.

In contrast, by employing the patterned film forming method of the invention which relies upon vacuum film formation, one can easily form a desired thickness of vacuum thin film on the transfer surface of the master.

In addition, film formation is selectively performed on the surfaces of ridges and valleys and scarcely on the side walls of the ridges. Hence, only the film formed on the surfaces of the ridges is transferred to the substrate, enabling a patterned film of high definition to be formed in high precision.

A patterned film can also be formed on the substrate using a resin paint if, as disclosed in JP 8-171008 A, a dry film having a resin coat is first prepared and then the resin coat is transferred from the dry film onto the master before it is re-transferred to the substrate.

The resin coat on the dry film contains a binder, so it has a strong internal cohesive power which, together with its stickiness, prevents the resin coat from breaking unless a very strong power is applied from outside. Hence, the resin coat transferred from the dry film onto the ridges of the master rarely breaks in appropriate conformance to the geometry of the ridges and in many cases the film transferred has a geometry different from that of the ridges. What is more, the resin coat has high contents of components other than functional ones such as the binder, so, in order to form a film that appropriately displays its function, a certain thickness is required; however, the internal cohesive force of the film, whether it is formed of a resin paint or by vacuum thin film technology, increases with thickness, further worsening the aforementioned problem.

In addition, given a large film thickness, the repeating of transfer steps in a suitable manner requires a corresponding increase in the height of the ridges of the master; however, the higher the ridges (i.e., the greater the depth of processing), the more difficult it is to achieve micro-processing and considerable difficulty is encountered in forming a pattern of high definition on the master.

In short, using the dry film described above, it is extremely difficult to ensure that a patterned film of high definition is formed in high precision by the transfer of a resin coat.

In contrast, the vacuum thin film has the necessary and sufficient strength and yet it does not have as strong internal cohesive force as the resin coat has, nor is it sticky as that. Hence, the film breaks in its interior fairly easily when force is applied from outside. What is more, the vacuum thin film little contains components other than functional ones, so it can be formed considerably thinner than the resin coat. The thinness of the film helps reduce the height of the ridges of the master and this allows the processing of even smaller features, thereby enabling a pattern of higher definition to be formed on the master with high precision.

Accordingly, when a vacuum thin film is formed on a certain member and transferred to the ridges of the master, the above described effects combine to produce a synergism, enabling the transfer of the vacuum thin film which has appropriate conformance to the geometry of the ridges; by transferring this vacuum thin film from the ridges onto the substrate, one can form a patterned film of high definition with high precision.

The patterned film forming method of the invention is further described below.

As already mentioned, there are two exemplary methods of forming a vacuum thin film on surfaces of the ridges of a master having a transfer surface with asperities formed in accordance with the patterned film to be eventually formed; one is by directly forming a vacuum thin film on the transfer surface by the vacuum film forming technology and the other is by first forming a vacuum thin film on a separate member and transferring it onto surfaces of the ridges of the master.

Before forming a vacuum thin film on the master, the transfer surface of the master is optionally cleaned (regenerated) such as by removing the vacuum thin film deposited in the valleys of the transfer surface.

In the case of forming a vacuum thin film directly on the transfer surface of the master, a predetermined thickness of film is formed on the transfer surface of the master as in the ordinary vacuum film forming technology.

In the patterned film forming method of the invention, the vacuum thin film on the ridges of the transfer surface is transferred to the substrate as already mentioned above. It is therefore quite natural that the surfaces of the ridges should allow smooth stripping of the vacuum thin film and in the present invention, to this end, at least the ridges of the transfer surface of the master are subjected to a stripping treatment before the vacuum thin film is formed on the transfer surface.

The method of stripping treatment is not limited in any particular way. Any method may be selected as appropriate taking surface properties, heat resistance, hardness, retention of performance, adhesion to the master, etc, into account and depending on the material for the master, the material for the vacuum thin film (namely, material for the patterned film to be formed), and so forth, as long as the relevant method can bring about an intended stripping effect.

In an exemplary method, a release layer is formed on the surfaces of at least the ridges of the transfer surface of the master prior to the film formation. Examples of the release layer include a silicone layer, a fluoroplastic layer, a wax layer, a water-soluble release layer, a water repelling layer using such a material as fluoroplastics and silicones, and a layer made of an inert material such as gold. The release layer may be formed by any method suitable for the release layer to be formed, in which the layer is formed, for instance, by applying/drying a paint using dip coating or spin coating procedures, by the vacuum film forming technology such as vacuum evaporation, or by plasma polymerization.

Alternatively, prior to film formation, a metal oxide film or a carbon film may be formed on the surfaces of at least the ridges of the transfer surface, or the surfaces of the ridges may be subjected to corona discharge or other plasma treatment either in vacuum or in the atmosphere, or some other method may be employed in order to inactivate the surface where film is to be formed, each being carried out as a stripping treatment.

Further, it is generally held that the lower the kinetic energy employed in vacuum film formation, the higher the strippability of the film that is formed. Hence, in the initial period of film formation, low enough energy may be applied to form a release undercoat on the surfaces of ridges of the transfer surface and subsequent film formation is performed using an amount of energy adapted for the film to be formed. Such measures are also taken as a stripping treatment.

In the second approach, a vacuum thin film is formed on a surface of any suitable member and transferred to the transfer surface (surfaces of ridges) of the master so that it is formed on the surfaces of ridges of the master. A sequence of steps in this approach is shown schematically in FIG. 1; a sheet of member 14 is provided and a vacuum thin film 16 is formed on a surface of the sheet by the vacuum film forming technology; the transfer surface of a master 12 at least the ridges of which have been subjected to such a stripping treatment as described above is then compressed against the vacuum thin film 16 and detached so that the latter is transferred to the master 12. When this approach is employed, the surface of the vacuum thin film 16 may be subjected to a stripping treatment similar to those described above, which is regarded as another stripping treatment for the surface of the master 12.

Figure 1:
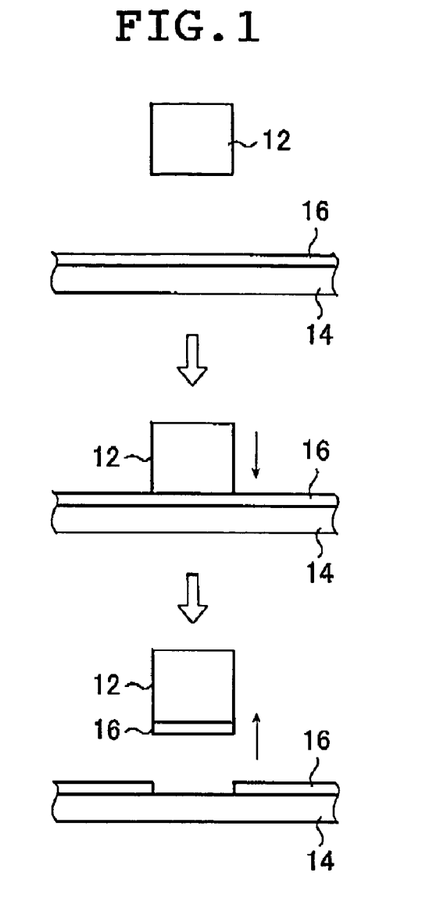
FIG. 1 shows in conceptual form a sequence of steps in the process of forming a vacuum thin film on a master when implementing the patterned film forming method of the invention.

Any member may be utilized as the member 14, on which the vacuum thin film is to be formed, as long as it allows for film formation by the vacuum film forming technology and transfer of the vacuum thin film 16 onto the master 12. Either a discrete member or a continuous web-like member may be employed.

The method of transferring the vacuum thin film from the member 14 onto the master 12 is not limited in any particular way, either, and a variety of methods can be employed, such as transfer under pressure and transfer by means of a vacuum press. If desired, heat may be applied during transfer. The temperature, pressure and period for this transfer are not limited in any particular way. The conditions for the transfer may be set as appropriate depending on the material for the vacuum thin film 16, the strippability from the member 14, etc. so that the transfer can be realized adequately.

Naturally, it is preferred in the second method of forming a vacuum thin film on the master 12 that the surface of the member 14 is subjected to a stripping treatment prior to the formation of the vacuum thin film 16, which is similar to that performed on the master 12.

Having thus formed a vacuum thin film on the transfer surface of the master, one may proceed to transfer the film from the surfaces of the ridges of the master onto a substrate on which a patterned film is to be formed, so that a patterned film is formed on the substrate.

Figure 2:
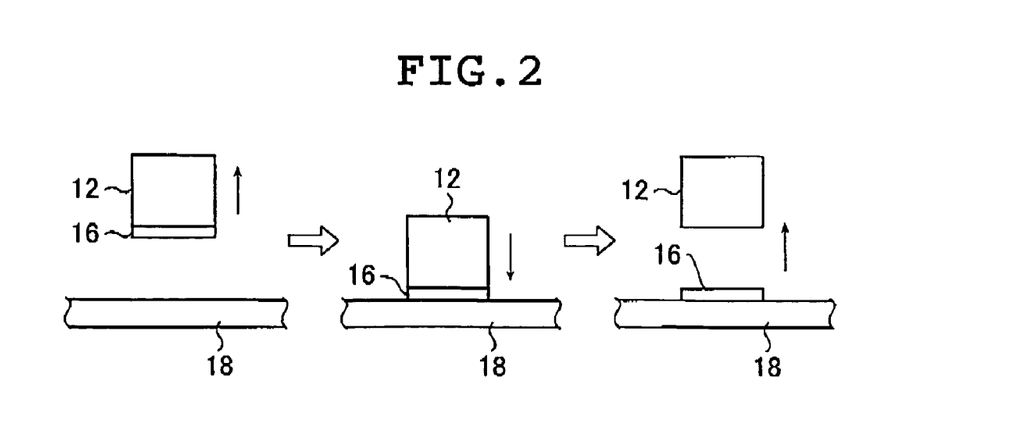
FIG. 2 shows in conceptual form a sequence of steps in the process of transferring a patterned film to a substrate when implementing the patterned film forming method of the invention.

A sequence of steps in this procedure is shown schematically in FIG. 2; the vacuum thin film 16 formed on the master 12 may be compressed against a sheet of substrate 18 and then detached, whereupon it is transferred to the substrate 18.

The temperature, pressure and period for this transfer (and the transporting speed if the transportation between transfer rolls is to be performed) are not limited in any particular way. The conditions for the transfer may be set as appropriate depending on the material for the vacuum thin film 16, the material for the master 12, the strippability of the vacuum thin film 16 from the master 12, etc. so that the transfer of the vacuum thin film 16 from the master 12 to the substrate 18 can be realized without fault.

The method of transferring the vacuum thin film from the master onto the substrate is not limited in any particular way and a variety of methods can be employed, such as transfer under pressure and transfer by means of a vacuum press. If desired, heat may be applied during transfer.

As will be apparent from the foregoing description, once the master is prepared, the patterned film forming method of the invention enables the formation of patterned films by using it repeatedly. Even if it takes fairly high cost to fabricate the master, the rate of production of patterned films is considerably increased while their production cost is reduced, with the added advantage of providing high reproducibility in the formation of patterned films. What is more, the patterned film forming method of the invention simplifies the sequence of steps, contributing to significantly reducing the initial investment for the production of patterned films.

If photolithographic, electroforming and like techniques are adopted in master fabrication, patterns having as high definition as is obtained by photolithography can be formed on the master to thereby accomplish the precise formation of patterned films of high definition. In particular, in the case of master fabrication by electroforming, once the preform (the original of the master) is fabricated, it may be used repeatedly to fabricate the master, thus offering particular advantage in such aspects as production cost and volume, as well as long-term reproducibility in pattern formation.

Moreover, the stripping treatment performed on the master according to the patterned film forming method of the invention can eliminate heating to a high temperature or compressing at a high pressure otherwise needed for film transfer and ensure the film transfer with arbitrary materials used.

The method of transferring a vacuum thin film formed on a master (transfer member) to a substrate (substrate on which a patterned film is to be formed) so as to form a patterned film on the substrate is exemplified by the method disclosed in JP 2918037 B as referred to above in which the patterned film is transferred from the master (transfer substrate) to the substrate on the basis of the sublimation or evaporation induced by heating the master to a high temperature. As stated before, the heat resistance, the sublimability, etc. required in the method of the Japanese patent result in very narrow options with respect to the patterned film forming material, the substrates, and so forth.

In addition, in order to ensure the transfer of the vacuum thin film formed on the master to the substrate in this method, heating to some extent or compressing with a strong force should be carried out so that the adhesion between the substrate and the film may be secured, although, in that case, increase in the adhesion between the master and the vacuum thin film takes place concurrently. As a result, in an exemplary case where the vacuum thin film is to be transferred to the surface of a multi-layered film, stripping may not be realized between the master and the vacuum thin film but between any two possible layers of the multi-layered film which have a smaller adhesion exerted therebetween and one or more layer films of the multi-layered film may inversely be transferred to the master (or the vacuum thin film). (For convenience sake, the event as such is hereunder referred to as "inverse transfer").

In contrast, according to the present invention in which the surface of the master is subjected to a stripping treatment as described above before a film is formed by the vacuum film forming technology, a sure film transfer can be realized without sublimation or evaporation induced by heating to a high temperature and the inverse transfer just mentioned above can be prevented, as well as the film forming material for a patterned film (vacuum thin film), the materials of which the master and the substrate are to be formed, respectively, and so forth can be selected at will.

Moreover, since the temperature and the compressing force used for the transfer of the patterned film from the master to the substrate can be decreased, it is possible to reduce stress and damages imposed on the vacuum thin film (patterned film as formed), other films in a multi-layered film, the substrate, and so forth to thereby form a patterned film of high quality and surely prevent again the inverse transfer as above.

The present invention has an additional effect of inhibiting the deposition of contaminants on the surface of the master by subjecting the surface to a stripping treatment, thus, when applied to light-emitting devices as described below for example, inhibiting the deterioration of characteristics such as defective light emission.

In an embodiment of the invention where a vacuum thin film is directly formed on the transfer surface of the master, only one requirement needs to be satisfied by each side of the vacuum thin film, good strippability for one side and strong adherence for the other side; hence, the vacuum thin film can be transferred more positively from the master to the substrate. In addition, since film formation is directly made on the transfer surface of the master by the vacuum film forming technology, a highly precise vacuum thin film can be formed on the surfaces of ridges of the master. Thus, the embodiment under consideration is suitable for the purpose of forming patterned films of high definition with higher precision.

There is another embodiment of the invention, where a vacuum thin film is formed on a suitable member and then transferred to the transfer surface of the master. In this embodiment, once a vacuum thin film is formed on a surface of a sheet or any other member that has a certain area, there is no need to perform vacuum film formation in subsequent steps and one can repeatedly form patterned films on the substrate, As another advantage of this method, the deposition of vacuum thin film in the valleys of the transfer surface of the master is so small that the frequency of cleaning the master can be considerably reduced. Thus, the embodiment under consideration is particularly suitable for a case where one wants to further improve the rate of production of patterned films.

In the present invention, the substrate on which patterned films are to be formed is not limited in any particular way and a variety of types may be employed as appropriate for a specific use. Hence, the substrate may be either discrete (e.g. a plastic sheet) or continuous in web form (e.g. a web of plastic film).

In principle, a patterned film is transferred to a discrete substrate as it is held stationary. On the other hand, the patterned film may be transferred to a continuous substrate as it is transported either continuously or intermittently. If the master is a continuous one, the patterned film may be transferred to the substrate which is transported continuously. If the master is a discrete one, the transfer step in principle is performed with the substrate being held stationary.

Needless to say, the patterned film (vacuum thin film) preferably has good adhesion to the substrate. To this end, the substrate may optionally be treated to have better adhesion before the patterned film is transferred from the master to the substrate.

To mention a few examples of the applicable surface treatment, exposure to electron beams, ozone treatment, corona discharge or glow discharge may be performed prior to transfer so as to activate a surface of the substrate (to which the patterned film is to be transferred).

Before the transfer step, an adhesive layer or a sticky layer may advantageously be formed on the substrate or the surface of the vacuum thin film on the ridges of the master. The adhesive or sticky agent to be employed may be chosen as appropriate for various factors including the type of the film to be transferred and the use of the non-heat resistant substrate on which the film has been formed.

In the present invention, the above-described procedure of patterned film formation may be repeated. To be more specific, a loop consisting of the following steps, formation of a vacuum thin film on the master→transfer of a patterned film to the substrate→formation of a vacuum thin film on the master, may be repeated to form a plurality of patterned films on a single substrate.

The step of cleaning the master may optionally be included within the loop.

In this process of loop repeating, the master may be changed in order to produce a substrate having different patterned films formed thereon.

When repeating the loop, patterned films may be stacked by transfer to a single site or, alternatively, the position of transfer may be changed. When changing the transfer position, there may be formed a continuous pattern consisting of interconnected patterned films or a plurality of spaced patterned films.

Needless to say, change of the master, stacking of patterned films, change of the transfer position and other options may be taken in combination.

If the transfer step is repeatedly performed on a single substrate, the step of positioning the master or the substrate is added as required before transfer of the vacuum thin film from the master.

In the present invention, the patterned film to be formed on the substrate may be single- or multi-layered. In order to form a multi-layered film, it may first be formed on the transfer surface of the master and then transferred to the substrate. Alternatively, a single-layered or multi-layered film formed on the transfer surface of the master may be transferred a plurality of times in order to form a multi-layered film on the substrate. If desired, these methods may be combined to form a multi-layered film on the substrate.

When a multi-layered film is formed by utilizing the patterned film forming method of the invention, a plurality of thin films as the stacked layers of the film may be formed on the substrate, on which the multi-layered film is to be formed, sequentially in a stacked manner, with at least one thin film being formed by the patterned film forming method of the invention.

Alternatively, the intended multi-layered film may be separated into two portions, that is to say, formed into two multi-layered films (or one being multi-layered and the other single-layered), at least one of which includes at least one layer or film formed by the patterned film forming method of the invention. The two films thus obtained may be stacked together so as to form the intended multi-layered film. (If desired, the intended multi-layered film may also be separated into three or more portions). In that case, if the intended multi-layered film includes the adjacent layers which have a smaller adhesion therebetween, such as a metallic layer and an organic metal material layer, it is preferred not to apply the patterned film forming method of the invention comprising the step of film transfer to one or the other multi-layered film that includes the adjacent layers as above. Such measures make it possible to prevent the inverse transfer more desirably and, what is more, the inverse transfer can be prevented more positively according to the present invention in which the surface of the master is subjected to a stripping treatment as described before. By forming a plurality of multi-layered films and stacking them together, the deterioration of characteristics and so forth of the eventual multi-layered film due to heat can also be prevented desirably because the films needing to be subjected to a heat treatment and those having a lower heat resistance can be formed separately from each other.

While the patterned film forming method of the invention has been described above in detail, it should be understood that the invention is by no means limited to the foregoing examples and various improvements and modifications may of course be made without departing from the spirit and scope of the invention.

In the example shown in FIG. 2, a patterned film is transferred from a discrete master to a web of substrate. This is not the sole case of the invention and the master and the substrate may be combined in various other ways; for instance, a discrete master may be combined with a discrete substrate or, alternatively, a web of master may be combined with a web of substrate. In yet another case, a patterned film may be transferred from a web of master to a discrete substrate.

The following specific examples are provided to further illustrate the patterned film forming method of the invention but are in no way to be taken as limiting. Unless otherwise noted, all procedures in the respective Examples were taken within a glove box purged with nitrogen to create an inert atmosphere.

EXAMPLE 1

<Transparent Electrode Plate a (Invention Sample)>

A surface of a glass plate measuring 25 mm×25 mm was treated to form a pattern of asperities in a central area of 15 mm×15 mm which consisted of ridges that measured 100 μm×100 μm and were spaced apart by 25 μm. In this way, there was prepared a master having a pattern of asperities on a surface (transfer surface, or the surface where film was to be formed).

To provide the pattern of asperities, a mask pattern that would cover the ridges was formed of a photoresist as applied to a surface of the glass plate and then dry etched with $CHF_3$ gas in plasma to make openings 2 μm deep and, thereafter, the photoresist was stripped from the glass plate.

The transfer surface of the master was cleaned with isopropyl alcohol (IPA), then dip coated with Oputsuru (fluoroplastics; DAIKIN INDUSTRIES, LTD.), and the organic solvent was dried to form a water-repellent layer on the surface of the master in a thickness of about 20 nm. The water-repellent layer serves as a stripping layer.

The surface of the water-repellent layer was subjected to dc sputtering to form a transparent conductive film (indium—tin oxide (ITO) film) in a thickness of about 200 nm. For the formation of ITO film, the ultimate degree of vacuum was $1 \times 10^{-3}$ Pa, the pressure of deposition was 0.5 Pa, the substrate temperature was 250° C., and the rate of deposition was 1 nm/sec.

The master on which the transparent electrode film was formed was placed over a substrate (polyethylene terephthalate (PET) film with a thickness of 188 μm) and the assembly was passed through a hot (50° C.) roller pair at a pressure of 0.3 MPa and at a speed of 0.05 mrmin to compress it thermally. Thereafter, the master was detached from the substrate to leave the transparent electrode film behind as it had been transferred to the obverse surface of the substrate. Thus, transparent electrode plate a was fabricated.

<Transparent Electrode Plate b (Invention Sample)>

Transparent electrode plate b was fabricated by repeating the procedure for fabricating transparent electrode plate a, except that the temperature at which the transparent electrode film was transferred from the master onto the substrate was increased to 90° C.

<Transparent Electrode Plate c (Invention Sample)>

Transparent electrode plate c was fabricated by repeating the procedure for fabricating transparent electrode plate a, except that a gold (Au) layer as a stripping layer was formed on the transfer surface of the master in a thickness of about 20 nm by vacuum evaporation instead of the water-repellent layer operating as a stripping layer.

For formation of the Au layer, the ultimate degree of vacuum was $5 \times 10^{-4}$ Pa and the rate of deposition was 1.0 nm/sec.

<Transparent Electrode Plate d (Invention Sample)>

Transparent electrode plate d was fabricated by repeating the procedure for fabricating transparent electrode plate c, except that the temperature at which the transparent electrode film was transferred from the master onto the substrate was increased to 90° C., <Transparent Electrode Plate e (Comparative Sample)>

Transparent electrode plate e was fabricated by repeating the procedure for fabricating transparent electrode plate a, except that the water-repellent layer operating as a stripping layer was not formed.

<Transparent Electrode Plate f (Comparative Sample)>

Transparent electrode plate f was fabricated by repeating the procedure for fabricating transparent electrode plate e, except that the temperature at which the transparent electrode film was transferred from the master onto the substrate was increased to 90° C.

The surfaces of the thus fabricated transparent electrode plates a–f were examined with an optical microscope (at given magnifications from 25 to 170) to evaluate the transferability of the respective transparent electrode films. The results are shown in Table 1 on the basis of the following criteria:

◎: the transparent electrode film was transferred over the total area to be transferred and each transfer region (ridge of the master) had sharp edges with no defect;

○: the transparent electrode film was transferred over the total area to be transferred, although each transfer region had edges with irregularities;

Δ: the transferred area was at least 80% and less than 100% of the total area to be transferred;

X: the transferred area was less than 80% of the total area to be transferred.

TABLE 1

| Transparent electrode plate No. | Stripping treatment of master | Transfer temperature | Transferability |
|---|---|---|---|
| a | water-repellent layer | 50° C. | ○ |
| b | ↓ | 90° C. | ◎ |
| c | gold | 50° C. | ○ |
| d | ↓ | 90° C. | ○ |
| e | none | 50° C. | X |
| f | ↓ | 90° C. | Δ |

If a transparent electrode film which is patterned is formed on a substrate of a lower heat resistance such as a PET substrate by a conventional methods such problems arise as a wide variation in etching rate and irregularities of pattern edges, both due to the non-uniformity of the crystallinity of the transparent electrode film, as well as the degradation of the film quality (for example, increase in resistivity) as a result of making a film material amorphous in order to effect a stable etching.

In contrast, according to the patterned film forming method of the invention, a transparent electrode film such as an ITO film which is patterned can be formed without etching and so forth and, what is more, a transparent electrode film formed at a high temperature which has a good crystallinity can be deposited onto a substrate of a lower heat resistance such as a PET film, as clearly shown by the above evaluation results. In other words, according to the present invention, a transparent electrode film desirably patterned to thereby have excellent characteristics can be formed even on a substrate of a lower heat resistance with a high productivity achieved by eliminating etching process.

EXAMPLE 2

A side of a 25 mm×25 mm glass plate was subjected to dc sputtering to form a transparent conductive film (ITO film) in a thickness of about 200 nm. For the formation of ITO film, the ultimate degree of vacuum was $1\times10^{-3}$ Pa, the pressure of deposition was 0.5 Pa, the substrate temperature was 250° C., and the rate of deposition was 1 nm/sec.

The transparent conductive film was connected to an aluminum lead wire and overlaid with a copper phthalocyanine layer that was formed in a thickness of about 10 nm by vacuum evaporation. For the formation of the copper phthalocyanine layer, the ultimate degree of vacuum was $5\times10^{-4}$ Pa and the rate of deposition was 0.4 nm/sec.

The copper phthalocyanine layer in turn was overlaid with an α-NPD (α-N,N'-dinaphthyl-N,N'-diphenylbenzidine) layer that was formed in a thickness of about 40 nm by vacuum evaporation. For the formation of the α-NPD layer which eventually led to the fabrication of a transparent electrode plate, the ultimate degree of vacuum was $5\times10^{-4}$ Pa and the rate of deposition was 0.4 nm/sec.

A surface of a glass plate measuring 25 mm×25 mm was treated to form a pattern of asperities in a central area of 15 mm×15 mm which consisted of ridges that measured 100 μm×100 μm and were spaced apart by 25 μm. In this way, there was prepared a master having a pattern of asperities on a surface (transfer surface, or the surface where film was to be formed). The pattern of asperities was formed similarly to that in Example 1.

The transfer surface of the master was cleaned with IPA, then dip coated with Oputsuru (fluoroplastics; DAIKIN INDUSTRIES, LTD.), and the organic solvent was dried to form a water-repellent layer on the surface of the master in a thickness of about 20 nm. The water-repellent layer serves as a stripping layer.

On the water-repellent layer was formed a layer of a low-molecular weight, red light-emitting material in a thickness of about 55 nm. The low-molecular weight, red light-emitting material was identical to Alq3 (having a structural formula as below) except that it was doped with 1 wt % of DCM (4-dicyanomethylene-2-methyl-6-(p-dimthylaminostyril)-4H-pyran). For the formation of the red light-emitting material layer, the ultimate degree of vacuum was $5\times10^{-4}$ Pa and the rate of deposition was 0.4 nm/sec.

The master on which the red light-emitting lay was formed was placed over the transparent electrode plate as referred to above and the assembly was passed through a hot (90° C.) roller pair at a pressure of 0.3 MPa and at a speed of 0.05 m/min to compress it thermally. Thereafter, the master was detached from the transparent electrode plate to leave the red light-emitting layer behind as it had been deposited to the obverse surface of the transparent substrate (the α-NPD layer).

By illuminating the surface of the thus formed red light-emitting layer with a uv ray and examining the surface with a fluorescence microscope (VB-6000 of KEYENCE) (at given magnifications from 25 to 170), it has been found the light-emitting layer was transferred over the total pixel area and each pixel had sharp edges with no defect.

The red light-emitting layer was then overlaid with an organic thin film layer that was formed from Alq3 as above by vacuum evaporation in a thickness of about 15 nm. For the formation of the thin film layer, the ultimate degree of vacuum was $5\times10^{-4}$ Pa and the rate of deposition was 0.4 nm/sec.

The organic thin film layer was overlaid with a lithium fluoride (LiF) layer that was formed by vacuum evaporation in a thickness of about 1.5 nm. For the formation of the LiF layer, the ultimate degree of vacuum was $5\times10^{-4}$ Pa and the rate of deposition was 0.1 nm/sec.

The LiF layer in turn was overlaid with an aluminum layer that was formed by vacuum evaporation in a thickness of about 250 nm. For the formation of the Al layer, the ultimate degree of vacuum was $5\times10^{-4}$ Pa and the rate of deposition was 5 nm/sec.

The formed aluminum layer was connected to an aluminum lead wire, thus a red light-emitting device prepared.

The thus fabricated light-emitting device was allowed to emit light by applying dc current with Source Measure Unit Model 2400 of KEYENCE and the state of light emission was examined with a microscope (at given magnifications from 25 to 170).

The pixels of the total pixel area emitted light and their luminous intensity was uniform throughout at a value of 100 cd or more, as well as each pixel had sharp edges without defect.

A light-emitting device was fabricated by repeating the procedure for fabricating the light-emitting device just mentioned above, except that the temperature at which the assembly of the master on which the red light-emitting layer was formed and the transparent electrode plate was thermally compressed was decreased to 50° C.

As a result, similar transferred state of the red light-emitting layer to the transparent electrode plate and similar characteristics of the light-emitting device were obtained.

Moreover, an attempt was made to fabricate a light-emitting device by repeating the procedure for fabricating the light-emitting device as mentioned above, except that the water-repellent layer as a stripping layer was not formed on the surface of a master.

An interlayer stripping was generated, however, between the ITO layer and the copper phthalocyanine layer when the master was detached from the transparent electrode plate after the assembly of the master on which the red light-emitting lay was formed and the transparent electrode plate was thermally compressed. Consequently, fabrication could not be progressed any further.

EXAMPLE 3

<Light-emitting Plate a (Invention Sample)>

[Preparing a substrate]

A polyimide film measuring 25 mm×25 mm with a thickness of 50 μm was set in a predetermined position within a vacuum chamber and an aluminum layer was formed by vacuum evaporation in a thickness of about 250 nm on a side of the film (the side is hereunder referred to as the obverse surface) to serve as a cathode. For the formation of the Al layer, the ultimate degree of vacuum was $5\times10^{-4}$ Pa and the rate of deposition was 5 nm/sec.

The formed aluminum layer was connected to an aluminum lead wire and overlaid with an LiF layer that was formed by vacuum evaporation in a thickness of about 1.5 nm. For the formation of the LiF layer, the ultimate degree of vacuum was $5\times10^{-4}$ Pa and the rate of deposition was 0.1 nm/sec.

The LiF layer in turn was overlaid with an organic thin film layer that was formed from Alq3 as referred to before by vacuum evaporation in a thickness of about 15 nm, thereby preparing a substrate. For the formation of the thin film layer, the ultimate degree of vacuum was $5\times10^{-4}$ Pa and the rate of deposition was 0.4 nm/sec.

[Preparing a Master]

A surface of a glass plate measuring 25 mm×25 mm was treated to form a pattern of asperities in a central area of 15 mm×15 mm which consisted of ridges that measured 100 μm×100 μm and were spaced apart by 25 μm. In this way, there was prepared a master having a pattern of asperities on a surface (transfer surface, or the surface where film was to be formed). The pattern of asperities was formed similarly to that of the master in Example 1.

[Forming a Red Light-emitting Layer]

The transfer surface of the master was cleaned with IPA, then dip coated with Oputsuru (fluoroplastics; DAIKIN INDUSTRIES, LTD.), and the organic solvent was dried to form a water-repellent layer on the surface of the master in a thickness of about 20 nm. The water-repellent layer serves as a stripping layer.

On the water-repellent layer was formed a layer of a low-molecular weight, red light-emitting material in a thickness of about 55 nm. The low-molecular weight, red light-emitting material was identical to Alq3 except that it was doped with 1 wt % of DCM. For the formation of the red light-emitting material layer, the ultimate degree of vacuum was $5\times10^{-4}$ Pa and the rate of deposition was 0.4 nm/sec.

[Fabricating Light-emitting Plate a]

The master on which the red light-emitting lay was formed was placed over the substrate prepared as above and the assembly was passed through a hot (90° C.) roller pair at a pressure of 0.3 MPa and at a speed of 0.05 m/min to compress it thermally. Thereafter, the master was detached from the substrate to leave the red light-emitting layer behind as it had been transferred to the obverse surface of the substrate. Thus, red light-emitting plate a was fabricated.

<Light-emitting Plate b (Comparative Sample)>

Light-emitting plate b was fabricated by repeating the procedure for fabricating light-emitting plate a, except that the water-repellent layer was not formed.

<Light-emitting Plate c (Comparative Sample)>

Light-emitting plate e was fabricated by repeating the procedure for fabricating light-emitting plate b, except that the temperature at which the light-emitting layer was transferred from the master onto the substrate was increased to 160° C.

<Light-emitting Plate d (Invention Sample)>

Light-emitting plate d was fabricated by repeating the procedure for fabricating light-emitting plate a, except that the temperature at which the light-emitting layer was transferred from the master onto the substrate was increased to 160° C.

<Light-emitting Plate e (Invention Sample)>

Light-emitting plate e was fabricated by repeating the procedure for fabricating light-emitting plate a, except that a gold (Au) layer as a stripping layer was formed on the transfer surface of the master in a thickness of about 20 nm by vacuum evaporation instead of the water-repellent layer as a stripping layer.

For formation of the Au layer, the ultimate degree of vacuum was $5 \times 10^{-4}$ Pa and the rate of deposition was 1.0 nm/sec.

<Light-emitting Plate f (Comparative Sample)>

Light-emitting plate f was fabricated by repeating the procedure for fabricating light-emitting plate a, except that the method of forming the red light-emitting layer (i.e., the method of fabricating the master) was changed to the following wet coating process.

[Forming a Light-emitting Layer]

The obverse surface of a substrate in sheet form was dip coated with a paint containing a polymeric red light-emitting material and dried to prepare a sheet having a red light-emitting layer formed in a thickness of 40 nm. To the thus formed red light-emitting layer, the transfer surface of a master was compressed and then detached to fabricate master R having the red light-emitting layer on the transfer surface.

The paint containing a red light-emitting material was prepared by desolving polyvinyl carbazole (with a molecular weight of 63,000; Aldrich) and bis(2-(2'-benzo[4,5-α]thienyl)pyridinato-N,C$^{3\prime}$) acetylacetonate iridium complex in dichloroethane at a weight ratio of 40:1.

<Light-emitting Plate g (Comparative Sample)>

Light-emitting plate g was fabricated by repeating the procedure for fabricating light-emitting plate f, except that the temperature at which the red light-emitting layer was transferred from master R onto the substrate was increased to 160° C.

<Light-emitting Plate h (Comparative Sample)>

Light-emitting plate h was fabricated by repeating the procedure for fabricating light-emitting plate f, except that prior to the deposition of the red light-emitting layer on the master, a water-repellent layer of the same type as employed in light-emitting plate a was formed on the transfer surface of the master in the same thickness.

<Evaluation of the Light-Emitting Plates>

The thus fabricated light-emitting plates a–h were illuminated with uv rays on the surfaces of the light-emitting layers. The illuminated surfaces were examined with a fluorescence microscope (VB-6000 of KEYENCE) (at given magnifications from 25 to 170) to evaluate the transferability of the respective light-emitting materials. The results are shown in Table 2 on the basis of the following criteria:

⊚: the light-emitting layer was transferred over the total pixel area and each pixel had sharp edges with no defect;

○: the light-emitting layer was transferred over the total pixel area, although each pixel had edges with irregularities;

Δ: the transferred area was at least 80% and less than 100% of the total pixel area;

X: the transferred area was less than 80% of the total pixel area.

TABLE 2

| Light-emitting Plate No. | Method of forming light-emitting layer | Stripping treatment of master | Transfer temperature | Transferability |
|---|---|---|---|---|
| a | evaporation | water-repellent layer | 90° C. | ⊚ |
| b | ↓ | none | ↓ | Δ |
| c | ↓ | ↓ | 160° C. | ○ |
| d | ↓ | water-repellent layer | ↓ | ⊚ |
| e | ↓ | gold | 90° C. | ○ |
| f | coating | none | ↓ | X |
| g | ↓ | ↓ | 160° C. | Δ |
| h | ↓ | water-repellent layer | 90° C. | X |

<Fabricating Light-emitting Devices>

[Preparing a Transparent Electrode Plate]

A side (hereunder designated the obverse-surface) of a 25 mm×25 mm glass plate was subjected to dc sputtering to form a transparent conductive film (ITO film) in a thickness of about 200 nm. For the formation of ITO film, the ultimate degree of vacuum was $1 \times 10^{-3}$ Pa, the pressure of deposition was 0.5 Pa, the substrate temperature was 250°C., and the rate of deposition was 1 nm/sec.

The transparent conductive film was connected to an aluminum lead wire and overlaid with a copper phthalocyanine layer that was formed in a thickness of about 10 nm by vacuum evaporation. For the formation of the copper phthalocyanine layer, the ultimate degree of vacuum was $5 \times 10^{-4}$ Pa and the rate of deposition was 0.4 nm/sec.

The copper phthalocyanine layer in turn was overlaid with an α-NPD layer that was formed in a thickness of about 40 nm by vacuum evaporation. For the formation of the α-NPD layer which eventually led to the fabrication of a transparent electrode plate, the ultimate degree of vacuum was $5 \times 10^{-4}$ Pa and the rate of deposition was 0.4 nm/sec.

[Fabricating Light-emitting Devices]

The thus fabricated transparent electrode plate and the previously fabricated light-emitting plate a were placed in superposition, with the obverse surface (transferred light-emitting layer) of the latter facing the surface of the former. The assembly was passed through a hot (90° C.) roller pair at a pressure of 0.3 MPa and at a speed of 0.05 m/min so that it would be thermally compressed to fabricate light-emitting device a.

The same procedure was performed on the transparent electrode plate and the light-emitting plates b–h to fabricate light-emitting devices b–h.

<Evaluating the Light-emitting Devices>

The thus fabricated light-emitting devices a–h were allowed to emit light by applying do current with Source Measure Unit Model 2400 of KEYENCE and the state of light emission was evaluated by examination with a microscope (at given magnifications from 25 to 170). The results are shown in Table 3 on the basis of the following criteria:

⊚: pixels of the total pixel area emitted light and their luminous intensity was uniform throughout at a value of 100 cd or more, as well as each pixel had sharp edges without defect;

○: pixels of the total pixel area emitted light and their luminous intensity was uniform throughout at a value of 100 cd or more, although each pixel had edges with irregularities;

Δ: the area of light emission was at least 80% and less than 100% of the total pixel area;

X: the area of light emission was less than 80% of the total pixel area.

TABLE 3

| Light-emitting Device No. | Light-emitting Plate No. | Method of forming light-emitting layer | Stripping treatment of master | Transfer Temperature | State of light emission |
|---|---|---|---|---|---|
| a | a | evaporation | water-repellent layer | 90° C. | ⊚ |
| b | b | ↓ | none | ↓ | Δ |
| c | c | ↓ | ↓ | 160° C. | X |
| d | d | ↓ | water-repellent layer | ↓ | X |
| e | e | ↓ | gold | 90° C. | ○ |
| f | f | coating | none | ↓ | X |
| g | g | ↓ | ↓ | 160° C. | Δ |
| h | h | ↓ | water-repellent layer | 90° C. | X |

<Fabricating Light-emitting Plates and Light-Emitting Devices and Evaluating them—(2)>

Using a master that was not cleaned after it had been employed once in the formation of a light-emitting layer and subsequent transfer, light-emitting plate i was fabricated by repeating the procedure for the light-emitting plate a. The thus prepared light-emitting plate i was used to fabricate light-emitting device i by repeating the procedure for the light-emitting device a.

Using a master that was employed ten consecutive times in the formation of light-emitting layers and subsequent transfer without an intervening cleaning step, light-emitting plate j was fabricated by repeating the procedure for the light-emitting plate a. The thus prepared light-emitting plate j was used to fabricate light-emitting device j by repeating the procedure for the light-emitting device a.

Using a master that was cleaned by standing for 10 minutes in DMF (N,N-dimethylformamide) at room temperature after it had been employed in the formation of a light-emitting layer and subsequent transfer, light-emitting plate k was fabricated by repeating the procedure for the light-emitting plate a. The thus prepared light-emitting plate k was used to fabricate light-emitting device k by repeating the procedure for the light-emitting device a.

Upon completion of their fabrication, the respective light-emitting plates were evaluated for the transferability of the light-emitting materials by entirely the same procedure as already described above. In addition, the fabricated light-emitting devices were evaluated for the state of light emission by entirely the same procedure as already described above.

The light-emitting plates i–k and the light-emitting devices i–k were all rated "⊚".

<Fabricating Light-emitting Plates and Light-Emitting Devices and Evaluating them—(3)>

Four light-emitting plates were prepared by repeating the procedures for the light-emitting plates a, b, e and f, respectively, except that the temperature at which the light-emitting layers were transferred from the masters to the substrates was decreased to 50° C., and then light-emitting devices were prepared by the same procedure as already described above so as to make similar evaluations of the light-emitting plates and the light-emitting devices.

In spite of having decreased the transfer temperature to 50° C. in this case, the results of evaluation were absolutely the same as those obtained in the case of the transfer temperature of 90° C.

As is clear from the above data, the patterned film forming method of the invention which involves the transfer of a vacuum thin film features high precision in micro-processing of the master and, in addition, when a mask shield is applied, the spacing between non-film forming areas (the spacing between valleys in the mask) can be made sufficiently small to ensure the production of patterned films that are finer, sharper and more free from blurs and bleeding than those patterned films which are formed by the transfer of wet coated films and those formed by evaporation using a mask. Despite the fineness of patterns, wider patterned regions (so-called light-emitting regions in the case of a light-emitting device) can be formed; hence, the patterned films are uniform throughout. As a further advantage, there are formed patterned films that reflect the smoothness of the master's surface without being affected by such factors as the characteristics of the substrate onto which patterned films are to be transferred and the surface properties of the patterned films to be formed. By controlling the environment of operations including master fabrication and thin film formation as through operations within vacuum or using a glove box, unwanted phenomena such as defects due to foreign matter can be considerably reduced. Therefore, by applying the invention to light-emitting devices, one can produce light emission that has high uniformity, covers a wide area and assures high enough definition to display image that has sharp pixel edges without blurs and bleeding.

What is more, one can easily achieve repeated formation of patterned films without cleaning the master, as well as effective regeneration of the master such as by cleaning and repeated use of it. Hence, a variety of products with patterned films can be produced at higher rate with higher operating efficiency.

As seen from the light-emitting plate c in Example 3, the vacuum thin film may appropriately be transferred from the master to the substrate not performing a stripping treatment but a heating and other treatment upon transfer. However, the deterioration of characteristics of the light-emitting layer etc. may frequently be induced as a result of heating, as evident from the result of evaluation of the light-emitting device c in the same Example.

In contrast, according to the present invention in which the surface of the master is subjected to a stripping treatment, the temperature and pressure required to transfer the vacuum thin film can be sufficiently reduced to prevent not only deterioration of the vacuum thin film to be transferred, the substrate, and a variety of layers on the substrate side but also an offset in the position of transfer of the patterned film on account of thermal expansion of the substrate and the like. Hence, as will be understood from the foregoing Examples, safe and stable fabrication can be achieved even when one forms a heat-sensitive patterned film as exemplified by light-emitting layers in light-emitting devices. In addition, deposition of contaminants onto the surface of the master due to, for instance, imparting of water-repellent characteristic can be prevented by performing a stripping treatment, thus the deterioration of characteristics such as defective light emission also prevented.

The effectiveness of the present invention are therefore clear from the foregoing data.

While the red light-emitting device was fabricated in Example 3 as above, it is also possible as a matter of course that a green light-emitting material and a blue light-emitting material are also used to form light-emitting layers on a master and the light-emitting layers of respective colors are transferred to a substrate offset from one another by ⅓ pixel in accordance with a subpixel of a light-emitting device so as to fabricate a three (or more)-color light-emitting device. In that case, a single master may be used for the transfer of each of the light-emitting layers of three colors or, alternatively, three masters may be used for the transfer of the light-emitting layers of three colors, respectively.

As described in detail on the foregoing pages, the patterned film forming method of the invention enables patterned films of high definition and precision to be formed on the obverse surface of a desired substrate at high production rate and at low cost while assuring satisfactory reproducibility.

What is claimed is:

1. A patterned film forming method, comprising steps of:
preparing a transfer member having a transfer surface on which asperities are formed in accordance with a film pattern to be formed;
performing stripping treatment on surfaces of at least ridges formed on said transfer surface of said transfer member;
thereafter forming a thin film formed by a technology of vacuum film formation on said surfaces of said at least ridges formed on said transfer surface of said transfer member; and
transferring said thin film formed on said surfaces of said at least ridges of said transfer member onto a substrate, thereby forming a patterned film on said substrate,
wherein said vacuum film formation is performed on a surface of a suitable member by said technology of said vacuum film formation and subsequently transferred to said surfaces of said at least ridges of said transfer surface of said transfer member, thereby forming said thin film formed by said technology of said vacuum film formation on said surfaces of said at least ridges formed on said transfer surface of said transfer member.

2. A patterned film forming method, comprising steps of:
preparing a transfer member having a transfer surface on which asperities are formed in accordance with a film pattern to be formed;
performing stripping treatment on surfaces of at least ridges formed on said transfer surface of said transfer member;
thereafter forming a thin film formed by a technology of vacuum film formation on said surfaces of said at least ridges formed on said transfer surface of said transfer member; and
transferring said thin film formed on said surfaces of said at least ridges of said transfer member onto a substrate, thereby forming a patterned film on said substrate,
wherein said patterned film formed on said substrate is a conductive film, and
wherein said stripping treatment comprises subjecting the surfaces of the ridges to plasma treatment or corona discharge.

3. The patterned film forming method according to claim 2, wherein said vacuum film formation is performed on said transfer surface of said transfer member on which the asperities are formed, thereby forming said thin film formed by said technology of said vacuum film formation on said surfaces of said at least ridges formed on said transfer surface of said transfer member.

4. The patterned film forming method according to claim 1, wherein said stripping treatment comprises forming one of a metal oxide film and a carbon film on surfaces of at least ridges formed on said transfer surface of said transfer member.

5. The patterned film forming method according to claim 1, wherein said stripping treatment comprises subjecting the surfaces of the ridges to plasma treatment.

6. The patterned film forming method according to claim 1, wherein said stripping treatment comprises subjecting the ridges to corona discharge.

7. The patterned film forming method according to claim 1, wherein said patterned film formed on said substrate is a transparent conductive film.

8. The patterned film forming method according to claim 1, wherein said patterned film formed on said substrate is a light-emitting layer.

9. The patterned film forming method according to claim 1, wherein said patterned film is a transparent conductive film, said substrate is transparent, and said method comprises forming a transparent conductive film on the transparent substrate.

10. The patterned film forming method according to claim 1, wherein said patterned film is a color light-emitting layer, said substrate is a light-emitting plate, and said method comprises forming said color light-emitting layer on said light-emitting plate.

11. The patterned film forming method according to claim 2, wherein said vacuum film formation is performed on a surface of a suitable member by said technology of said vacuum film formation and subsequently transferred to said surfaces of said at least ridges of said transfer surface of said transfer member, thereby forming said thin film formed by said technology of said vacuum film formation on said surfaces of said at least ridges formed on said transfer surface of said transfer member.

12. The patterned film forming method according to claim 2,
wherein said patterned film formed on said substrate is a transparent conductive film that is made of a material selected from the group consisting of indium-tin oxide, zinc oxide and titanium nitride.

13. The patterned film forming method according to claim 2, wherein said patterned film is a transparent conductive film, said substrate is transparent, and said method comprises forming said transparent conductive film on said transparent surface.

14. A patterned film forming method, comprising steps of:
preparing a transfer member having a transfer surface on which asperities are formed in accordance with a film pattern to be formed;
performing stripping treatment on surfaces of at least ridges formed on said transfer surface of said transfer member;
thereafter forming a thin film formed by a technology of vacuum film formation on said surfaces of said at least ridges formed on said transfer surface of said transfer member; and
transferring said thin film formed on said surfaces of said at least ridges of said transfer member onto a substrate, thereby forming a patterned film on said substrate,
wherein said patterned film formed on said substrate is a light-emitting layer.

15. The patterned film forming method according to claim 14, wherein said vacuum film formation is performed on said transfer surface of said transfer member on which the asperities are formed, thereby forming said thin film formed by said technology of said vacuum film formation on said surfaces of said at least ridges formed on said transfer surface of said transfer member.

16. The patterned film forming method according to claim 14, wherein said vacuum film formation is performed on a surface of a suitable member by said technology of said vacuum film formation and subsequently transferred to said surfaces of said at least ridges of said transfer surface of said transfer member, thereby forming said thin film formed by said technology of said vacuum film formation on said surfaces of said at least ridges formed on said transfer surface of said transfer member.

17. The patterned film forming method according to claim 14, wherein said stripping treatment comprises forming one of a metal oxide film and a carbon film on surfaces of at least ridges formed on said transfer surface of said transfer member.

18. The patterned film forming method according to claim 14, wherein said stripping treatment comprises subjecting the surfaces of the ridges to plasma treatment or corona discharge.

19. The patterned film forming method according to claim 14, wherein said patterned film is a color light-emitting layer, said substrate is a light-emitting plate, and said method comprises forming said color light-emitting layer on said light-emitting plate.

20. The patterned film forming method according to claim 2, wherein said patterned film formed on said substrate is a conductive film which is transparent to the extent that it can be used as a TFT element requiring a transparent electrode.

* * * * *